(12) United States Patent
Kamel et al.

(10) Patent No.: US 7,992,159 B2
(45) Date of Patent: Aug. 2, 2011

(54) OPTICAL PICKUP DEVICE AND OPTICAL DISC DEVICE WITH SUCH OPTICAL PICKUP DEVICE MOUNTED THEREON

(75) Inventors: Tomotada Kamel, Osaka (JP); Kouji Ieki, Osaka (JP)

(73) Assignee: Panasonic Corporation, Osaka (JP)

( * ) Notice: Subject to any disclaimer, the term of this patent is extended or adjusted under 35 U.S.C. 154(b) by 536 days.

(21) Appl. No.: 12/282,684

(22) PCT Filed: Mar. 13, 2007

(86) PCT No.: PCT/JP2007/054984
§ 371 (c)(1),
(2), (4) Date: Sep. 12, 2008

(87) PCT Pub. No.: WO2007/105732
PCT Pub. Date: Sep. 20, 2007

(65) Prior Publication Data
US 2009/0040902 A1    Feb. 12, 2009

(30) Foreign Application Priority Data
Mar. 14, 2006  (JP) ................................ 2006-069608

(51) Int. Cl.
*G11B 7/12* (2006.01)
(52) U.S. Cl. ........................................................ 720/685
(58) Field of Classification Search ................ 720/685
See application file for complete search history.

(56) References Cited

U.S. PATENT DOCUMENTS

| | | | | |
|---|---|---|---|---|
| 6,151,284 A * | 11/2000 | Watanabe et al. | ............. | 720/601 |
| 7,131,129 B2 * | 10/2006 | Nankumo | ................. | 720/683 |
| 7,370,338 B2 * | 5/2008 | Mitsumoto et al. | ........... | 720/601 |
| 7,540,003 B2 * | 5/2009 | Omori et al. | ................. | 720/653 |
| 7,577,967 B2 * | 8/2009 | Li et al. | .................... | 720/650 |
| 7,587,727 B2 * | 9/2009 | Iizuka et al. | ................. | 720/652 |
| 2005/0094505 A1 | 5/2005 | Kanazawa | | |

FOREIGN PATENT DOCUMENTS

JP    01-243249    9/1989

(Continued)

OTHER PUBLICATIONS

International Search Report for corresponding Application No. PCT/JP2007/054984 dated Apr. 24, 2007.

*Primary Examiner* — Mark Blouin
(74) *Attorney, Agent, or Firm* — Renner, Otto, Boisselle & Sklar, LLP (57) ABSTRACT

An optical disk apparatus according to the present invention includes an optical pickup device and a control section for controlling an operation of the optical pickup device. The optical pickup device includes a plurality of first wiring lines for transmitting signals from the control section, a second wiring line to be used for an adjustment of the optical pickup device, and a connector section which is electrically connected to the first wiring lines. The optical disk apparatus further includes a flexible printed wiring board (FPC) which is connected to the connector section for electrically connecting the first wiring lines to the control section. The FPC includes a plurality of third wiring line for electrically connecting the first wiring lines to the control section, such that a pitch of the plurality of third wiring lines in a central portion of the FPC is broader than a pitch of the plurality of third wiring lines in a region of the FPC adjoining the connector section. Moreover, the connector section is electrically connected to the second wiring line, and the FPC being connected to the connector section electrically connects the first wiring lines to the control section, but does not electrically connect the second wiring line to the control section.

11 Claims, 5 Drawing Sheets

FOREIGN PATENT DOCUMENTS

| | | |
|---|---|---|
| JP | 10-062451 | 3/1998 |
| JP | 10-092005 | 4/1998 |
| JP | 10-172164 | 6/1998 |
| JP | 2002-133674 | 5/2002 |
| JP | 2005-085299 | 3/2005 |
| JP | 2006-040400 | 2/2006 |

* cited by examiner

OPTICAL PICKUP DEVICE AND OPTICAL DISC DEVICE WITH SUCH OPTICAL PICKUP DEVICE MOUNTED THEREON

TECHNICAL FIELD

The present invention relates to an optical pickup device with which to perform optical recording and/or reproduction of data, and an optical disk apparatus incorporating the optical pickup device.

BACKGROUND ART

Optical memory technology has gained prevalence, where optical disk media are employed as high-density and large-capacity storage media for recording data such as video, audio, text, programs, etc. Particularly prevalent are DVDs (Digital Versatile Discs), CDs (Compact Disc), and the like, which have pit patterns. This optical memory technology uses a finely-converged light beam to record data onto an optical disk medium with a high precision and reliability.

The principle of recording will be briefly described. For example, in the case where data is to be recorded onto an optical disk medium having a phase-changeable material, the optical disk medium is irradiated with light which is modulated in pulse form, at a power which is higher than that during reproduction, thus causing the phase-changeable material to go through intermittent phase changes. As a result, a changing pattern of reflectance of the phase-changeable material is created, whereby data recording is performed.

During reproduction, the optical disk medium is irradiated with a low power of light which will not cause phase changes in the phase-changeable material, thus detecting a changing pattern of reflectance of the phase-changeable material, whereby data is reproduced.

Such recording/reproduction operations are performed by an optical pickup device. Functions of an optical pickup device are generally classified into: formation of a diffraction-limited minute spot by converging light which is output from a light source; focusing control; tracking control; detection of a pit signal; and so on. These functions are realized with a combination of various optics and approaches of photoelectric conversion/detection, which is made in accordance with the purpose and application.

In order to allow light to be converged down to a diffraction limit, semiconductor laser elements are generally used as light sources. Thus, a small semiconductor laser element is mounted in an optical pickup device.

With an expansion in the applications of optical disk media, optical disk medium formats for higher recording densities have been developed, and the light spot to be formed during data recording/reproduction has become even smaller in size. The size of a light spot of laser light is in inverse proportion to the NA of an objective lens which is used for convergence, and is in proportion to the wavelength of the laser light. Therefore, in order to obtain a minute light spot size, the wavelength of laser light has been reduced.

Thus, in a situation where optical disk media for higher recording densities are being developed, from the standpoint of effectively utilizing the data and resources which a user may have acquired in the past, an optical disk apparatus is required to be able to perform recording/reproduction for a plurality of types of optical disk media of respectively different formats.

One technique of supporting a plurality of formats is to mount a plurality of optical pickup devices in an optical disk apparatus. However, in terms of downsizing of the apparatus, it is desirable if a single optical pickup device can support a plurality of formats. This makes it necessary to mount on a single optical pickup device a plurality of semiconductor laser elements of respectively different oscillation wavelengths, and also mount a plurality of photodetectors that correspond to the respective semiconductor laser elements and a plurality of actuators, etc., for controlling the positions of the optical elements with a high precision corresponding to a high recording density.

This has led to an increase in the number of circuit wiring lines for allowing signals to be input to or output from an optical pickup device, which also necessitates an increase in the space occupied by them within the optical disk apparatus. This results in problems such as constraints on the placement of parts, and deterioration of signals and limitations on current-carrying capacity due to narrower pitches of wiring patterns.

In order to address such problems, a technique of reducing the number of signal lines to be taken out from the optical pickup device is disclosed in Patent Document 1.

From the optical pickup device of Patent Document 1, wiring lines which are used only at the time of making adjustments for the device during production are taken out. An adjustment circuit which makes adjustments for the device is connected to the wiring lines for adjustment purposes.

When making adjustments for the optical pickup device, the wiring lines for adjustment purposes are used to supply adjustment signals to the optical pickup device, and various adjustments are performed, e.g., position adjustment and characteristic adjustment for the respective component elements. After the adjustments, the wiring lines which are needed only for the adjustments are cut at a point near an end of the optical pickup device. By cutting off the wiring lines which are needed only for the adjustments, the number of wiring lines to be taken out from the optical pickup device can be reduced.

[Patent Document 1] Japanese Laid-Open Patent Publication No. 2005-85299

DISCLOSURE OF INVENTION

Problems to be Solved by the Invention

However, after the adjustments for the component elements of the optical pickup device, the wiring lines that are no longer necessary are cut off, and the portions having been cut off are discarded together with the adjustment circuit, thus resulting in a waste of resource and an increase in materials cost.

Moreover, burrs may occur in the copper foil pattern where it is cut, leading to a possibility that adjoining wiring lines may come in contact to cause a malfunction of the optical pickup device.

Moreover, since the wiring lines for adjustment purposes are cut off, it becomes difficult to enable all functions to operate when a re-adjustment of the optical pickup device is needed or when an analysis of a defective product is to be made.

The present invention has been made in view of the aforementioned problems, and provides an optical pickup device and optical disk apparatus which reduces the number of wiring lines to be taken out from a flexible printed wiring board, suppresses a waste of resource and an increase in materials cost, and facilitates re-adjustment of the optical pickup device, analysis of a defective product, and the like. Moreover, the present invention provides a flexible printed wiring board which suppresses signal deteriorations and which has a high permissible current value, as well as an optical disk apparatus incorporating the same.

Means for Solving the Problems

An optical disk apparatus according to the present invention is an optical disk apparatus comprising: an optical pickup device; and a control section for controlling an operation of the optical pickup device, the optical pickup device including: a plurality of first wiring lines for transmitting signals from the control section; a second wiring line to be used for an adjustment of the optical pickup device; and a connector section which is electrically connected to the first wiring lines, characterized in that the optical disk apparatus further includes a flexible printed wiring board which is connected to the connector section for allowing the first wiring lines to be electrically connected to the control section; the flexible printed wiring board includes a plurality of third wiring lines for electrically connecting the first wiring lines to the control section; and a pitch of the plurality of third wiring lines in a central portion of the flexible printed wiring board is broader than a pitch of the plurality of third wiring lines in a region of the flexible printed wiring board adjoining the connector section.

In one embodiment, the connector section is electrically connected to the second wiring line; and the flexible printed wiring board being connected to the connector section electrically connects the first wiring lines to the control section, but does not electrically connect the second wiring line to the control section.

In one embodiment, the optical pickup device further includes: a semiconductor laser element for outputting laser light, and a driving circuit for driving the semiconductor laser element; the optical pickup device includes a plurality of said second wiring lines; one of the second wiring lines is electrically connected to an anode of the semiconductor laser element; and another of the second wiring lines is electrically connected to a cathode of the semiconductor laser element.

In one embodiment, the optical pickup device further includes a driving circuit for driving a light source which outputs light; when receiving a digital signal, the driving circuit drives the light source based on the digital signal, and when receiving an analog signal, the driving circuit drives the light source based on the analog signal; and the second wiring line is a signal line for inputting the analog signal to the driving circuit.

In one embodiment, the optical pickup device further includes a driving circuit for driving a light source which outputs light, and a digital potentiometer for adjusting an amplitude of a high-frequency current which is output by the driving circuit to drive the light source; and the second wiring line is a control line for transmitting a control signal for controlling the potentiometer.

In one embodiment, the optical pickup device further includes a driving circuit for driving a light source which outputs light, and a digital potentiometer for adjusting a frequency of a high-frequency current which is output by the driving circuit to drive the light source; and the second wiring line is a control line for transmitting a control signal for controlling the potentiometer.

In one embodiment, the optical pickup device further includes a front light monitor for receiving a portion of light which is output from a light source and outputting a photodetection signal which is in accordance with an amount of received light, a digital potentiometer for adjusting a gain of the front light monitor; and the second wiring line is a control line for transmitting a control signal for controlling the potentiometer.

In one embodiment, the optical pickup device further includes a photodetector having a photodetecting region which is split into a plurality of regions; the photodetector outputs a plurality of types of photodetection signals which are generated based on amounts of light respectively received by the plurality of regions; the plurality of types of photodetection signals include a photodetection signal for position adjustment of the photodetector; and the second wiring line is a signal line for transmitting the photodetection signal for position adjustment.

A flexible printed wiring board according to the present invention is a flexible printed wiring board for electrically connecting an optical pickup device and a control section for controlling an operation of the optical pickup device, the optical pickup device including: a plurality of first wiring lines for transmitting signals from the control section; a second wiring line to be used for an adjustment of the optical pickup device; and a connector section which is electrically connected to the first wiring lines, characterized in that the flexible printed wiring board includes a plurality of third wiring lines for electrically connecting the first wiring lines to the control section when connected to the connector section and the control section; and a pitch of the plurality of third wiring lines in a central portion of the flexible printed wiring board is broader than a pitch of the plurality of third wiring lines in a region of the flexible printed wiring board to be connected to the connector section.

An optical pickup device according to the present invention is an optical pickup device comprising: a first wiring line for transmitting a signal from a control section for controlling an operation of the optical pickup device; a second wiring line to be used for an adjustment of the optical pickup device; and a connector section which is electrically connected to the first and second wiring lines, characterized in that, during an adjustment of the optical pickup device, a first flexible printed wiring board for electrically connecting the first and second wiring lines to an adjustment circuit is connected to the connector section; and after the adjustment, a second flexible printed wiring board which electrically connects the first wiring line to the control section but does not electrically connect the second wiring line to the control section is connected to the connector section.

A production method for an optical disk apparatus according to the present invention is a production method for an optical disk apparatus having an optical pickup device, and a control section for controlling an operation of the optical pickup device, the optical pickup device including: a first wiring line for transmitting a signal from the control section; a second wiring line to be used for an adjustment of the optical pickup device; and a connector section which is electrically connected to the first and second wiring lines, characterized in that the production method comprises: a first step of connecting to the connector section a first flexible printed wiring board for electrically connecting the first and second wiring lines to an adjustment circuit, and performing an adjustment for the optical pickup device; and a second step of, after the first step, connecting to the connector section a second flexible printed wiring board which electrically connects the first wiring line to the control section but does not electrically connect the second wiring line to the control section.

Effects of the Invention

According to the present invention, an optical pickup device includes: first wiring lines for transmitting signals from a control section; a second wiring line to be used for an adjustment of the optical pickup device; and a connector section which is electrically connected to the first and second wiring lines. A flexible printed wiring board to be connected to the connector section electrically connects the first wiring lines to the control section, but does not electrically connect the second wiring line to the control section.

On this flexible printed wiring board, no wiring lines for electrically connecting the second wiring line to the control section are provided, and the corresponding space can be allotted to third wiring lines. The third wiring lines are wiring lines for electrically connecting the first wiring lines to the control section. By broadening the wiring pitch of the third wiring lines (i.e., by thickening the third wiring lines or broadening the interval between third wiring lines), the permissible current value of the third wiring lines can be enhanced and also signal deterioration can be prevented, thus improving the stability of recording/reproduction operations.

Moreover, the flexible printed wiring board is connected to the optical pickup device via the connector section, thus facilitating attachment or detachment of the flexible printed wiring board; therefore, there is no need to cut the wiring pattern after adjustments. Since reuse of a flexible printed wiring board for adjustment purposes for electrically connecting the first and second wiring lines to an adjustment circuit is possible, the flexible printed wiring boards to be discarded can be greatly reduced, whereby a waste of resource and an increase in materials cost can be suppressed. Since it is easy to attach or detach the flexible printed wiring board, re-connection of the flexible printed wiring board for adjustment purposes and the adjustment circuit to the optical pickup device is easy, and re-adjustment at the time of repairing the optical pickup device, defective product analysis, and the like can be easily performed.

In one embodiment, one of a plurality of second wiring lines is electrically connected to an anode of an semiconductor laser element, and another of the second wiring lines is electrically connected to a cathode of the semiconductor laser element. By preparing a simplified current source for the adjustment circuit, the semiconductor laser element can be caused to emit light, and it is easy to attach or detach the flexible printed wiring board for adjustment purposes. Therefore, adjustment or re-adjustment of the semiconductor laser element during production, defective product analysis, and the like can be easily performed.

In one embodiment, the driving circuit for driving a light source is a circuit which, when receiving a digital signal, drives the light source based on the digital signal, and when receiving an analog signal, drives the light source based on the analog signal, and the second wiring line is a signal line for inputting an analog signal to the driving circuit. By preparing a simplified analog circuit for the adjustment circuit, the semiconductor laser element can be caused to emit light, and it is easy to attach or detach the flexible printed wiring board for adjustment purposes. Therefore, adjustment or re-adjustment of the semiconductor laser element during production, defective product analysis, and the like can be easily performed.

In one embodiment, the second wiring line is a control line for transmitting a control signal with which to control a digital potentiometer for adjusting the amplitude and/or frequency of a high-frequency current that is output from a driving circuit of the light source. Since it is easy to attach or detach the flexible printed wiring board for adjustment purposes, adjustment or re-adjustment of the digital potentiometer during production, defective product analysis, and the like can be easily performed.

In one embodiment, the second wiring line is a control line for transmitting a control signal with which to control a digital potentiometer for adjusting the gain of a front light monitor. Since it is easy to attach or detach the flexible printed wiring board for adjustment purposes, adjustment or re-adjustment of the digital potentiometer during production, defective product analysis, and the like can be easily performed.

In one embodiment, the second wiring line is a output line for transmitting a photodetection signal for position adjustment that is output from a photodetector. Since it is easy to attach or detach the flexible printed wiring board for adjustment purposes, adjustment or re-adjustment of the photodetector during production, defective product analysis, and the like can be easily performed.

BRIEF DESCRIPTION OF DRAWINGS

FIGS. 1 (*a*) and (*b*) are diagrams showing an optical disk apparatus according to Embodiment 1 of the present invention.

FIGS. 3 (*a*) and (*b*) are diagrams showing an optical pickup device according to Embodiment 1 of the present invention.

DESCRIPTION OF THE REFERENCE NUMERALS

1*b* transporting FPC, for use in product form 2 signal line, for use in product form 3 signal line for photodetector, for use in product form 4 signal line for photodetector, for use in product form 5 semiconductor laser element 6 semiconductor laser element driving IC 7 digital potentiometer for varying high-frequency superposition amplitude 8 digital potentiometer for varying high-frequency superposition frequency 9 front light monitor 10 digital potentiometer for gain adjustment of front light monitor output 11 main FPC 12*b* control section, for use in product form 13 photodetector 21 signal line connected to anode of semiconductor laser element 22 signal line connected to cathode of semiconductor laser element 23 control line for digital potentiometer 7

24 control line for digital potentiometer 8

25 control line for digital potentiometer 10

26 signal line for photodetector to be used during production 27 signal line for photodetector to be used during production

BEST MODE FOR CARRYING OUT THE INVENTION

Hereinafter, embodiments of the present invention will be described with reference to the drawings. Like reference numerals will be attached to like component elements, and detailed descriptions thereof will be omitted.

Embodiment 1

Figure 1:
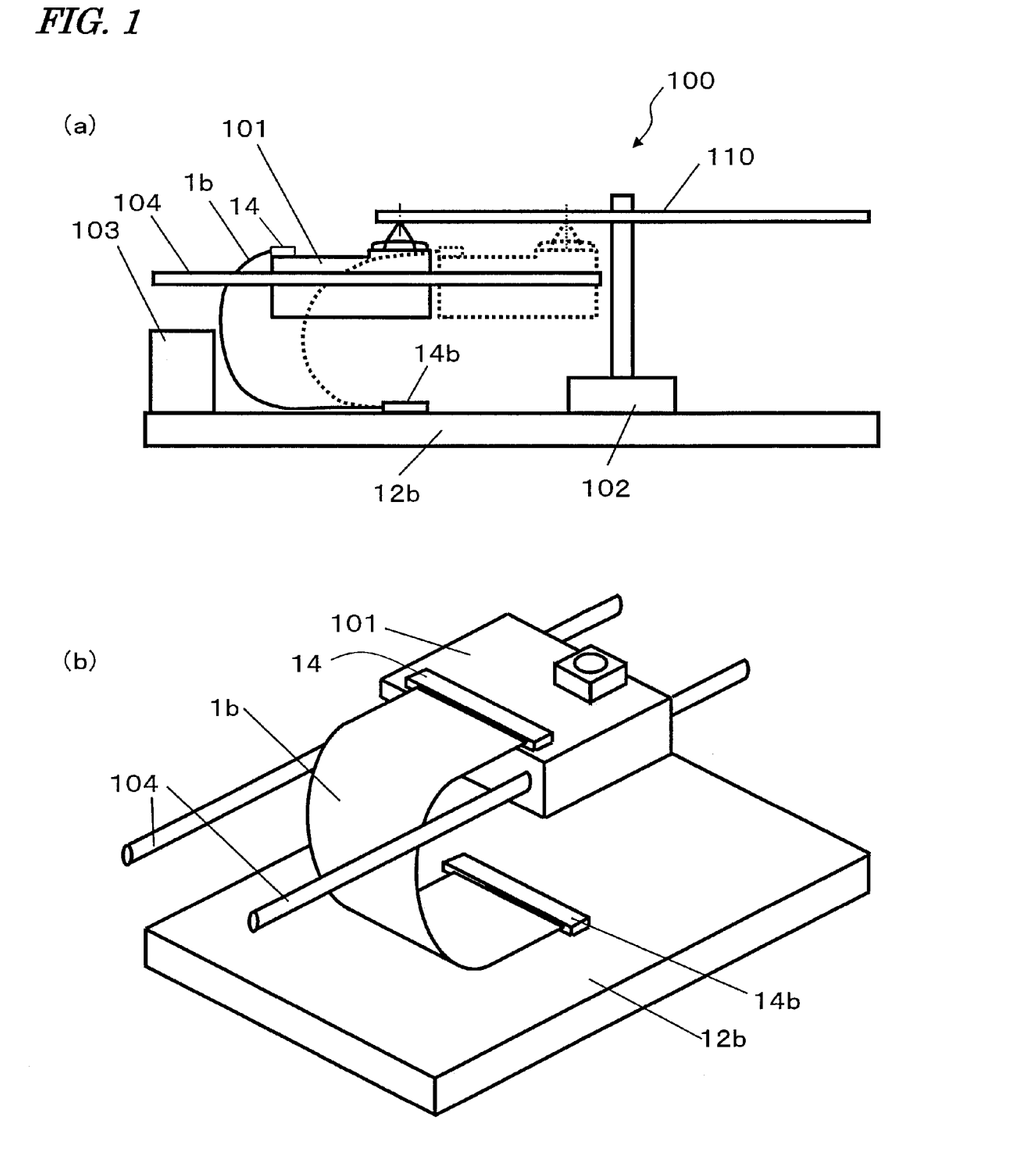

First, with reference to FIG. 1, a first embodiment of an optical disk apparatus according to the present invention will be described. FIG. 1 is a diagram schematically showing an optical disk apparatus 100 according to the present embodiment. The optical disk apparatus 100 may be a recording/reproduction apparatus, a reproduction apparatus, a recording apparatus, etc., which performs optical recording and/or reproduction of data for an optical disk medium 110.

With reference to FIG. 1(a), the optical disk apparatus 100 includes an optical pickup device 101, a motor 102 for supporting and rotating the optical disk medium 110, a control section 12b for controlling the operation of the optical pickup device 101, a transporting flexible printed wiring board 1b for electrically connecting the optical pickup device 101 and the control section 12b to each other, a power supply 103 for supplying electric power to the control section 12b, and guide shafts 104 for supporting the optical pickup device 101.

A connector 14 for connecting the transporting flexible printed wiring board 1b to the optical pickup device 101 is provided on the optical pickup device 101. A connector 14b for connecting the transporting flexible printed wiring board 1b to the control section 12b is provided on the control section 12b.

Next, a basic operation of the optical disk apparatus 100 will be described.

The optical disk medium 110 having been set on the optical disk apparatus 100 is rotated by the motor 102. The optical pickup device 101 sends to the control section 12b a signal representing relative positioning with respect to the optical disk medium 110. The control section 12b subjects this signal to calculation, and outputs to a moving mechanism (not shown) a signal for moving the optical pickup device 101 in a generally radial direction along the guide shafts 104 and a signal for causing a minute movement of an objective lens (not shown) within the optical pickup device 101. As a result, focus servo control and tracking servo control for the optical disk medium 110 are performed, whereby a recording, reproduction or erase of data for the optical disk medium 110 occurs. The power supply 103 supplies electric power to the control section 12b, the optical pickup device 101, the motor 102, and a driving mechanism (not shown) of the optical pickup device 101. Note that connection terminals for the power supply or the external power supply may be provided on each driving circuit. Hereinafter, a flexible printed wiring board will be referred to as an FPC (Flexible Print Circuit).

FIG. 1(b) is a perspective view showing relative positioning between the transporting FPC 1b and the guide shafts 104. Since the transporting FPC 1b is situated between the two guide shafts 104, its width is limited to less than the length between the guide shafts 104. Thus, since there is a limit to the width of the transporting FPC 1b, there are limits to the pitch and number of wiring lines extending through the transporting FPC 1b.

The width of the transporting FPC 1b may be e.g. 40 mm at the most, although it depends on the design. If no wiring lines are to be provided in the regions of 0.5 mm at both sides of the transporting FPC 1b, then the width of a region in which to provide the wiring lines will be 39 mm. Assuming that the minimum width of a wiring line for safely enduring bending is 0.15 mm and that the distance between wiring lines is 0.1 mm, it is calculated that a maximum of 156 wiring lines can be provided in the 39 mm-wide region. However, taking into the account the fact that a permissible current of a copper wiring line having a width of 0.1 mm is about 0.1 mA, for example, the actual wiring lines need to be thicker, and therefore the number of wiring lines that can be provided will be much smaller. For example, the widths of the driving wires for the objective lens, the motor, and the actuator will have to be 0.4 to 0.6 mm/wire. Moreover, wiring for laser driving will require a current of several hundred mA flowing therethrough, and therefore needs a broad width. Ground lines also need a broad width. Moreover, in order to suppress crosstalk between adjoining wiring lines, it is necessary to prescribe the distance between wiring lines to 0.2 mm or more, for example. Thus, the width, interval, number, etc. of the wiring lines extending through the transporting FPC 1b are under various limitations. According to the present invention, the pitch of the wiring lines extending through the transporting FPC 1b is broadened under such limitations. The details of the wiring pitch will be described later.

Next, the optical pickup device 101 will be described more specifically.

Figure 2:
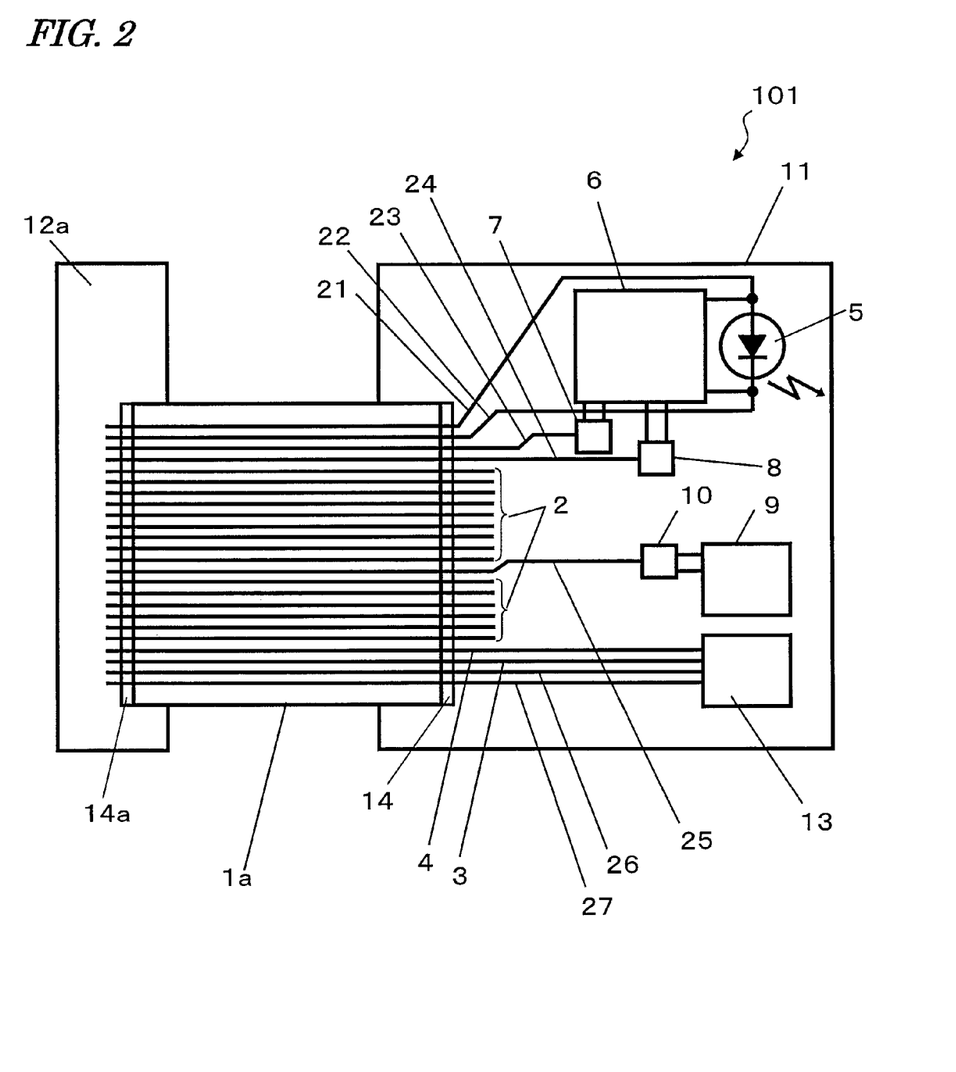
FIG. 2 A diagram showing an optical pickup device according to Embodiment 1 of the present invention.

FIG. 2 is a diagram schematically showing the optical pickup device 101 of the optical disk apparatus 100 during production. The optical pickup device 101 includes a main FPC 11.

A wiring pattern of a metal foil is formed on the main FPC 11, and is used for the inputting and outputting of electrical signals for the component elements of the optical pickup device 101 and for supplying electric power. Some of the component elements of the optical pickup device 101 are provided on the main FPC 11.

The optical pickup device 101 includes: a semiconductor laser element 5 which is a light source that outputs laser light; a semiconductor laser element driving IC (Integrated Circuit) 6 for driving the semiconductor laser element 5; a signal line 21 which is electrically connected to the anode side of the semiconductor laser element 5; a signal line 22 which is electrically connected to the cathode side of the semiconductor laser element 5; a digital potentiometer 7 for adjusting the amplitude of a high-frequency current that is output from the semiconductor laser element driving IC 6 for driving the semiconductor laser element 5; a digital potentiometer 8 for adjusting the frequency of the high-frequency current; a control line 23 for transmitting a control signal with which to control the digital potentiometer 7; and a control line 24 for transmitting a control signal with which to control the digital potentiometer 8.

The semiconductor laser element driving IC 6 is a driving circuit for driving the semiconductor laser element 5 to emit light of a desired light amount. The digital potentiometers 7 and 8 adjust the amplitude and frequency of a high-frequency current which is superposed on a driving current to be supplied to the semiconductor laser element 5.

The optical pickup device 101 further includes: a front light monitor 9 which, for the light amount control of the semiconductor laser element 5, receives a portion of light that is output from the semiconductor laser element 5, and subjects the portion of light to photoelectric conversion so as to output a photodetection signal which is in accordance with the amount of received light; a digital potentiometer 10 for adjusting the gain of a photodetection signal that is output from the front light monitor 9; a control line 25 for transmitting a control signal with which to control the digital potentiometer 10; a photodetector 13 having a photodetecting region which is split into a plurality of regions; signal lines 3, 4, 26, and 27 for transmitting a signal that is output from the photodetector 13; and signal lines 2 for supplying signals or electric power to the component elements of the optical pickup device 101. The photodetector 13 receives laser light which is emitted from the semiconductor laser element 5 and comes reflected from the optical disk medium 110 (FIG. 1) with data being contained therein, and subjects the laser light to a photoelectric conversion so as to covert it into a photodetection signal for output. The signal lines 2 are wiring lines which are necessary for operations such as recording/reproduction when a produced optical disk apparatus has been shipped as a product and is actually used at the user's hand (hereinafter described as being "in product form"). The signal lines 2 are also used for adjustment operations of the optical pickup device 101 during production. The signal lines 2 are electrically connected to the component elements of the optical pickup device 101 via a wiring pattern not shown. Some of the signal lines 2 are power supply lines.

A transporting FPC 1*a* is an FPC which is connected to the optical pickup device 101 during production of the optical pickup device 101. The connector 14 which is mounted on the main FPC 11 is in electrical connection with each wiring line of the main FPC 11. Via the connector 14, the transporting FPC 1*a* is electrically connected to each wiring line of the main FPC 11.

An adjustment circuit 12*a* is a circuit for performing adjustments for the component elements of the optical pickup device 101 (position adjustment, characteristic adjustment, etc., for the component elements) during production of the optical pickup device 101. The transporting FPC 1*a* is electrically connected to the adjustment circuit 12*a* via a connector 14*a* which is mounted on the adjustment circuit 12*a*. As a result, the adjustment circuit 12*a* and the main FPC 11 become electrically connected, so that signals are transmitted between the adjustment circuit 12*a* and the main FPC 11 via the transporting FPC 1*a*. The transporting FPC 1*a* and the adjustment circuit 12*a* are used not only during production of the optical pickup device 101, but also during a re-adjustment at the time of repair, defective product analysis, and the like.

Figure 3:
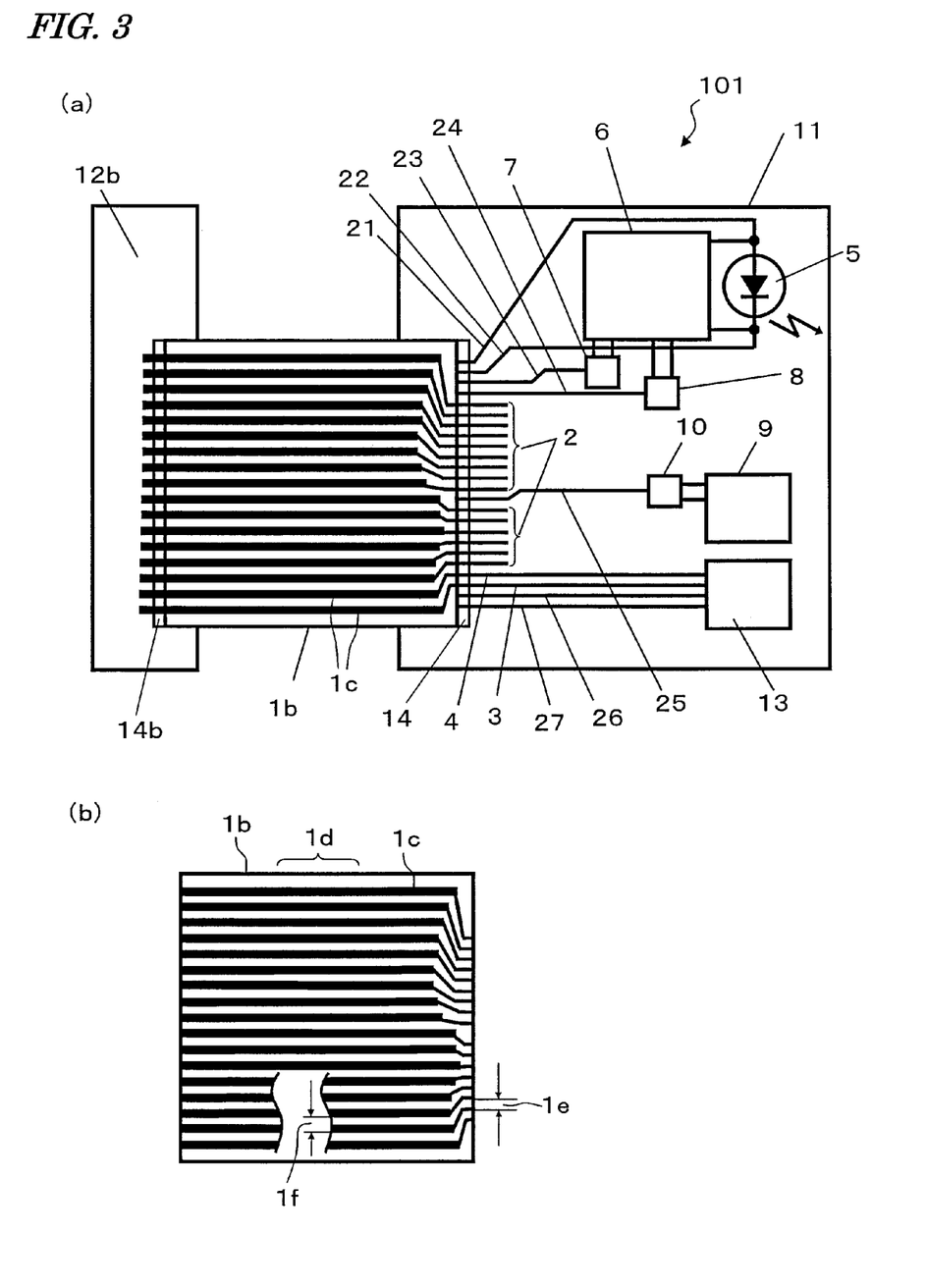

FIG. 3(*a*) is a diagram schematically showing the optical pickup device 101 of the optical disk apparatus 100 in product form.

As has been described with reference to FIG. 1, the transporting FPC 1*b* is an FPC for use in product form, and includes a plurality of third wiring lines 1*c* for electrically connecting some of the wiring lines of the main FPC 11 to the control section 12*b*. By being connected to the connector 14, the transporting FPC 1*b* is electrically connected to some of the wiring lines of the main FPC 11. By being connected to the connector 14*b* mounted on the control section 12*b*, the transporting FPC 1*b* is electrically connected to the control section 12*b*. As a result of this, the control section 12*b* and the main FPC 11 become electrically connected so that signals are transmitted between the control section 12*b* and the main FPC 11 via the transporting FPC 1*b*.

With reference to FIG. 2 and FIG. 3, the semiconductor laser element driving IC 6, which operates with a signal from the adjustment circuit 12*a* or the control section 12*b*, operates by receiving digital serial data, this being in order to allow the semiconductor laser element 5 to emit light corresponding to a complicated strategy during a recording operation. Therefore, the adjustment circuit 12*a* and the control section 12*b* need to include complex digital circuitry which supports such data transfer.

However, among the production steps of the optical pickup device 101, there are some steps where the semiconductor laser element 5 does not need to emit light according to any complicated strategy. For example, during an emission test of the semiconductor laser element 5 or an alignment of the optical axes of some optical elements, etc., it suffices to merely effect a CW (Continuous Wave) emission with an appropriate power. In the optical pickup device 101, the signal lines 21 and 22 are directly connected to the anode and the cathode of the semiconductor laser element 5. In the transporting FPC 1*a* to be used during production, a wiring pattern for electrically connecting the signal lines 21 and 22 to the adjustment circuit 12*a* is provided. By supplying to the signal lines 21 and 22 currents from a simple current source circuit included in the adjustment circuit 12*a*, the semiconductor laser element 5 can be caused to emit light.

Thus, during production, the transporting FPC 1*a* is connected to the connector section 14, an adjustment for the optical pickup device 101 is made. After this adjustment, the transporting FPC 1*a* is detached from the connector section 14, and the transporting FPC 1*b* for use in product form is connected to the connector section 14.

When in product form, it is unnecessary to directly cause the semiconductor laser element 5 to emit light by using the signal lines 21 and 22. Therefore, as shown in FIG. 3(*a*), no wiring pattern for electrically connecting the signal lines 21 and 22 to the control section 12*b* is provided on the transporting FPC 1*b* for use in product form (i.e., the transporting FPC 1*b* does not electrically connect the signal lines 21 and 22 and the control section 12*b*). Since the space on the transporting FPC 1*b* corresponding to this omission can be allotted for other wiring lines which are needed in product form, the other wiring lines which are needed in product form can be made thick, whereby signal deterioration is prevented and the permissible current value of the wiring lines is enhanced, thus improving the stability of recording/reproduction operations.

FIG. 3(*b*) is a diagram showing pitches of the wiring lines 1*c* included in the transporting FPC 1*b*. For the aforementioned reason, a pitch 1*f* of the wiring lines 1*c* in a central portion 1*d* of the FPC can be made broader than a pitch 1*e* of the wiring lines 1*c* in a region of the transporting FPC 1*b* adjoining the connector section 14 (i.e., a connection region to the connector section 14). For example, a wiring pattern for electrically connecting the signal lines 2 to 4 for use in product form and the control section 12*b* is provided on the transporting FPC 1*b*, and these wiring lines 1*c* can be made thick, whereby the aforementioned effect is obtained. Moreover, the distance between adjoining wiring lines 1*c* can be made long, whereby crosstalk between wiring lines can be suppressed. As mentioned above, various thicknesses and inter-wire distances are required of the individual wiring lines which are included in the FPC; according to the present invention, design freedom for such individual wiring lines can be enhanced.

Moreover, since the FPC 1*a* or 1*b* is connected to the main FPC 11 via the connector section 14, it is easy to attach or detach the FPCs 1*a* and 1*b*. Therefore, there is no need to cut the wiring pattern on the transporting FPC 1*a* after the adjustments during production. Since reuse of the transporting FPC 1*a* is possible, the FPCs to be discarded can be greatly reduced, whereby a waste of resource and an increase in materials cost can be suppressed. Since it is easy to attach or detach the FPCs 1*a* and 1*b*, re-connection of the FPC 1*a* to the main FPC 11 is easy, and re-adjustment at the time of repairing the optical pickup device 101, defective product analysis, and the like can be easily performed. For example, even when it becomes necessary to cause the semiconductor laser element 5 to emit light by using a simplified current source, this can be easily done by reconnecting the transporting FPC 1a to the main FPC 11.

Next, the digital potentiometers 7 and 8 and the wiring thereof will be described. In order to reduce the RIN (Relative Intensity Noise) of the semiconductor laser element 5, the semiconductor laser element driving IC 6 superposes a high-frequency current on the driving current for the semiconductor laser element 5. The digital potentiometer 7 is connected to a terminal for high-frequency current amplitude adjustment (not shown) of the semiconductor laser element driving IC 6, and by changing a characteristic value of the digital potentiometer 7, it is possible to change the amplitude of the high-frequency current to be output to the semiconductor laser element 5. The digital potentiometer 8 is connected to a terminal for high-frequency current frequency adjustment (not shown) of the semiconductor laser element driving IC 6, and by changing a characteristic value of the digital potentiometer 8, it is possible to change the frequency of the high-frequency current to be output to the semiconductor laser element 5. Such adjustments of amplitude and frequency are performed in order to absorb variations in the characteristics of the semiconductor laser element 5 and the oscillation circuit of the semiconductor laser element driving IC 6 so as to obtain optimum emission characteristics.

A wiring pattern for electrically connecting the control lines 23 and 24 to the adjustment circuit 12a is provided on the transporting FPC 1a to be used during production. Thus, instructions are sent from the adjustment circuit 12a to the digital potentiometers 7 and 8 for performing amplitude and frequency adjustments of the high-frequency current. The adjusted values of the digital potentiometers 7 and 8 are retained in non-volatile memories that are internalized in the digital potentiometers 7 and 8.

Thus, during production, the transporting FPC 1a is connected to the connector section 14 and adjustments for the optical pickup device 101 are performed. After these adjustments, the transporting FPC 1a is detached from the connector section 14, and the transporting FPC 1b for use in product form is connected to the connector section 14.

Since the adjusted values of the digital potentiometers 7 and 8 are retained in the non-volatile memories internalized in the digital potentiometers 7 and 8, the control lines 23 and 24 are no longer necessary after the adjustments are made during production of the optical pickup device 101. Therefore, as shown in FIG. 3, the transporting FPC 1b for use in product form does not include any wiring pattern for electrically connecting the control lines 23 and 24 to the control section 12b (i.e., the transporting FPC 1b does not electrically connect the control lines 23 and 24 to the control section 12b). Since the space on the transporting FPC 1b corresponding to this omission can be allotted for other wiring lines which are needed in product form, the other wiring lines which are needed in product form can be made thick, whereby signal deterioration is prevented and the permissible current value of the wiring lines is enhanced, thus improving the stability of recording/reproduction operations. For example, a wiring pattern for electrically connecting the signal lines 2 to 4 for use in product form to the control section 12b is provided on the transporting FPC 1b; these signal lines can be made thick.

Moreover, similarly to the above description, the FPCs to be discarded can be greatly reduced, whereby a waste of resource and an increase in materials cost can be suppressed, and re-adjustment at the time of repairing the optical pickup device 101, defective product analysis, and the like can be easily performed. For example, when it has become necessary to re-adjust the amplitude and frequency of the high-frequency current, this can be easily done by reconnecting the transporting FPC 1a to the main FPC 11.

Next, the digital potentiometer 10 and the wiring thereof will be described. The front light monitor 9 receives a portion of laser light that is output from the semiconductor laser element 5, and outputs an electrical signal which is generated through photoelectric conversion. Since the intensity of the laser light is controlled by this electrical signal, it is necessary that a certain ratio is established between the laser light output from the semiconductor laser element 5 and the electrical signal output from the front light monitor 9.

The digital potentiometer 10 is connected to a terminal for output gain adjustment (not shown) of the front light monitor 9, and by changing a characteristic value of the digital potentiometer 10, it is possible to change the output voltage of the front light monitor. Thus, the output voltage of the front light monitor can be adjusted so that the laser light output from the semiconductor laser element 5 and the electrical signal output from the front light monitor 9 are in a certain ratio.

Since a wiring pattern for electrically connecting the control line 25 and the adjustment circuit 12a is provided on the transporting FPC 1a to be used during production, an instruction is sent from the adjustment circuit 12a to the digital potentiometer 10 for performing an adjustment for the output voltage of the front light monitor. The adjusted value of the digital potentiometer 10 is retained in a non-volatile memory internalized in the digital potentiometer 10.

Thus, during production, the transporting FPC 1a is connected to the connector section 14, and adjustments for the optical pickup device 101 are performed. After these adjustments, the transporting FPC 1a is detached from the connector section 14, and the transporting FPC 1b for use in product form is connected to the connector section 14.

Since the adjusted values of the digital potentiometer 10 are retained in non-volatile memories that are internalized in the digital potentiometer 10, the control line 25 is no longer necessary after adjustments are made during production of the optical pickup device 101. Therefore, as shown in FIG. 3, no wiring pattern for electrically connecting the control line 25 and the control section 12b is provided on the transporting FPC 1b for use in product form (i.e., the transporting FPC 1b does not electrically connect the control line 25 and the control section 12b). Since the space on the transporting FPC 1b corresponding to this omission can be allotted for other wiring lines which are needed in product form, the other wiring lines which are needed in product form can be made thick, whereby signal deterioration is prevented and the permissible current value of the wiring lines is enhanced, thus improving the stability of recording/reproduction operations. For example, a wiring pattern for electrically connecting the signal lines 2 to 4 for use in product form to the control section 12b is provided on the transporting FPC 1b; these signal lines can be made thick.

Moreover, similarly to the above description, the FPCs to be discarded can be greatly reduced, whereby a waste of resource and an increase in materials cost can be suppressed, and re-adjustment at the time of repairing the optical pickup device 101, defective product analysis, and the like can be easily performed. For example, when it has become necessary to re-adjust the output gain of the front light monitor 9, this can be easily done by reconnecting the transporting FPC 1a to the main FPC 11.

Next, the photodetector 13 and the wiring thereof will be described.

The photodetector 13 receives laser light which is reflected and returns from the optical disk medium, and outputs electrical signals which are generated through photoelectric conversion. The photodetector 13 includes a photodetecting region which is split into a plurality of regions, each of the plurality of regions generating an electrical signal which is in accordance with the amount of received light. A plurality of types of photodetection signals which combine the signals generated by the plurality of regions are output from the photodetector 13. The output photodetection signals are used for data reproduction, focusing control, tracking control, and the like.

Among the signal lines 3, 4, 26, and 27 which transmit photodetection signals, the signal lines 26 and 27 are used during production of the optical pickup device 101, but not in product form. For example, in order to perform position adjustment for the photodetector 13 with a high precision, photodetectors for adjustment purposes (not shown) which are relatively small as compared to the photodetector 13 are provided on the photodetector 13; portions of laser light entering the photodetector 13 are received by the photodetectors for adjustment purposes; and photodetection signals for position adjustment, which correspond to the received light, are output via the signal lines 3 and 4. Since a wiring pattern for electrically connecting the signal lines 26 and 27 to the adjustment circuit 12a is provided on the transporting FPC 1a to be used during production, photodetection signals for position adjustment are received by the adjustment circuit 12a, and thus position adjustment or the like for the photodetector 13 can be performed.

Thus, during production, the transporting FPC 1a is connected to the connector section 14, and adjustments for the optical pickup device 101 are performed. After these adjustments, the transporting FPC 1a is detached from the connector section 14, and the transporting FPC 1b for use in product form is connected to the connector section 14.

After position adjustments for the photodetector 13 are made during production, the position of the photodetector 13 is fixed by adhesion or other means, and therefore the signal lines 26 and 27 are no longer necessary. Therefore, as shown in FIG. 3, no wiring pattern for electrically connecting the signal lines 26 and 27 to the control section 12b is provided on the transporting FPC 1b for use in product form (i.e., the transporting FPC 1b does not electrically connect the signal lines 26 and 27 to the control section 12b). Since the space on the transporting FPC 1b corresponding to this omission can be allotted for other wiring lines which are needed in product form, the other wiring lines which are needed in product form can be made thick, whereby signal deterioration is prevented and the permissible current value of the wiring lines is enhanced, thus improving the stability of recording/reproduction operations. For example, a wiring pattern for electrically connecting the signal lines 2 to 4 for use in product form to the control section 12b is provided on the transporting FPC 1b; these signal lines can be made thick.

Moreover, similarly to the above description, the FPCs to be discarded can be greatly reduced, whereby a waste of resource and an increase in materials cost can be suppressed, and re-adjustment at the time of repairing the optical pickup device 101, defective product analysis, and the like can be easily performed. For example, when it has become necessary to re-adjust the position of the photodetector 13, this can be easily done by reconnecting the transporting FPC 1a to the main FPC 11.

Embodiment 2

Next, with reference to FIG. 4 and FIG. 5, a second embodiment of an optical pickup device according to the present invention will be described.

Figure 4:
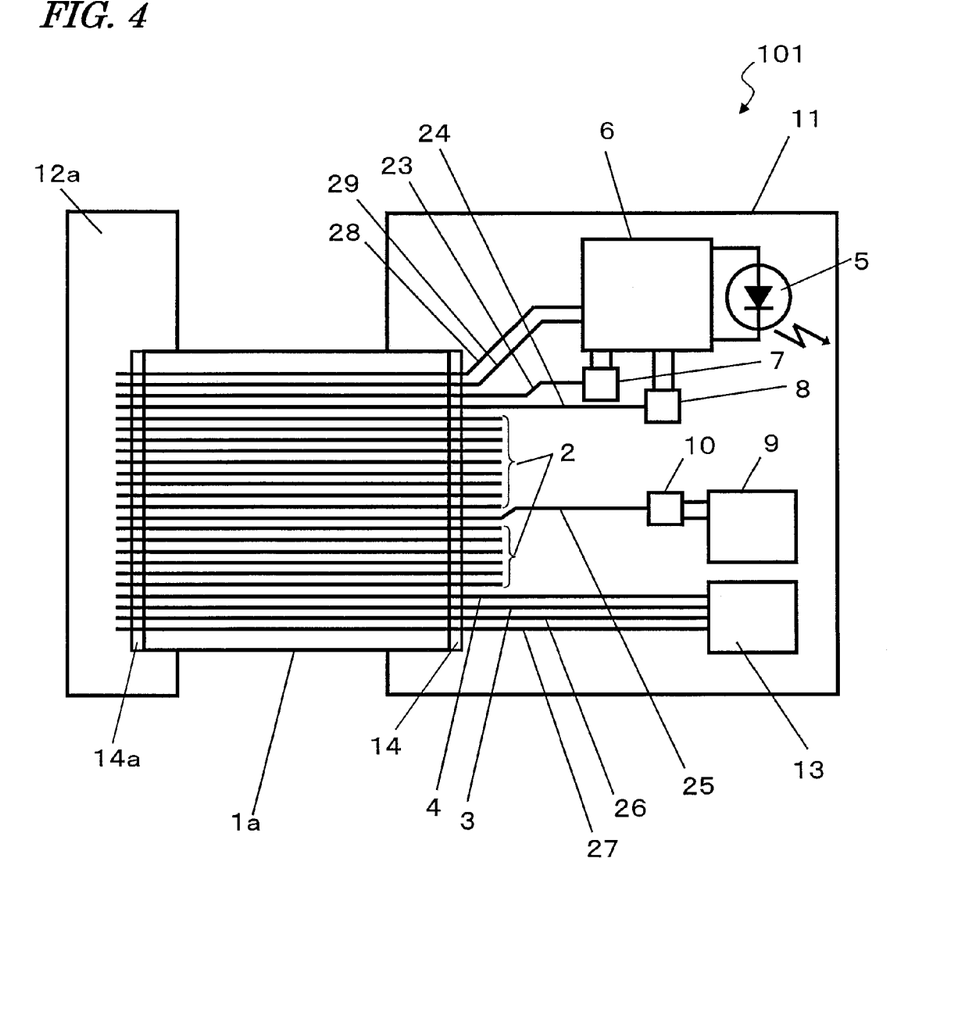
FIG. 4 A diagram showing an optical pickup device according to Embodiment 2 of the present invention.

FIG. 4 is a diagram schematically showing an optical pickup device 101 during production. FIG. 5 is a diagram schematically showing the optical pickup device 101 in product form.

With reference to FIG. 4, when receiving a digital signal as a command to drive the semiconductor laser element 5, the semiconductor laser element driving IC 6 of the present embodiment drives the semiconductor laser element 5 based on the digital signal, and when receiving an analog signal, drives the semiconductor laser element 5 based on the analog signal. The main FPC 11 includes a signal line 29 for inputting an analog signal to the semiconductor laser element driving IC 6.

Figure 5:
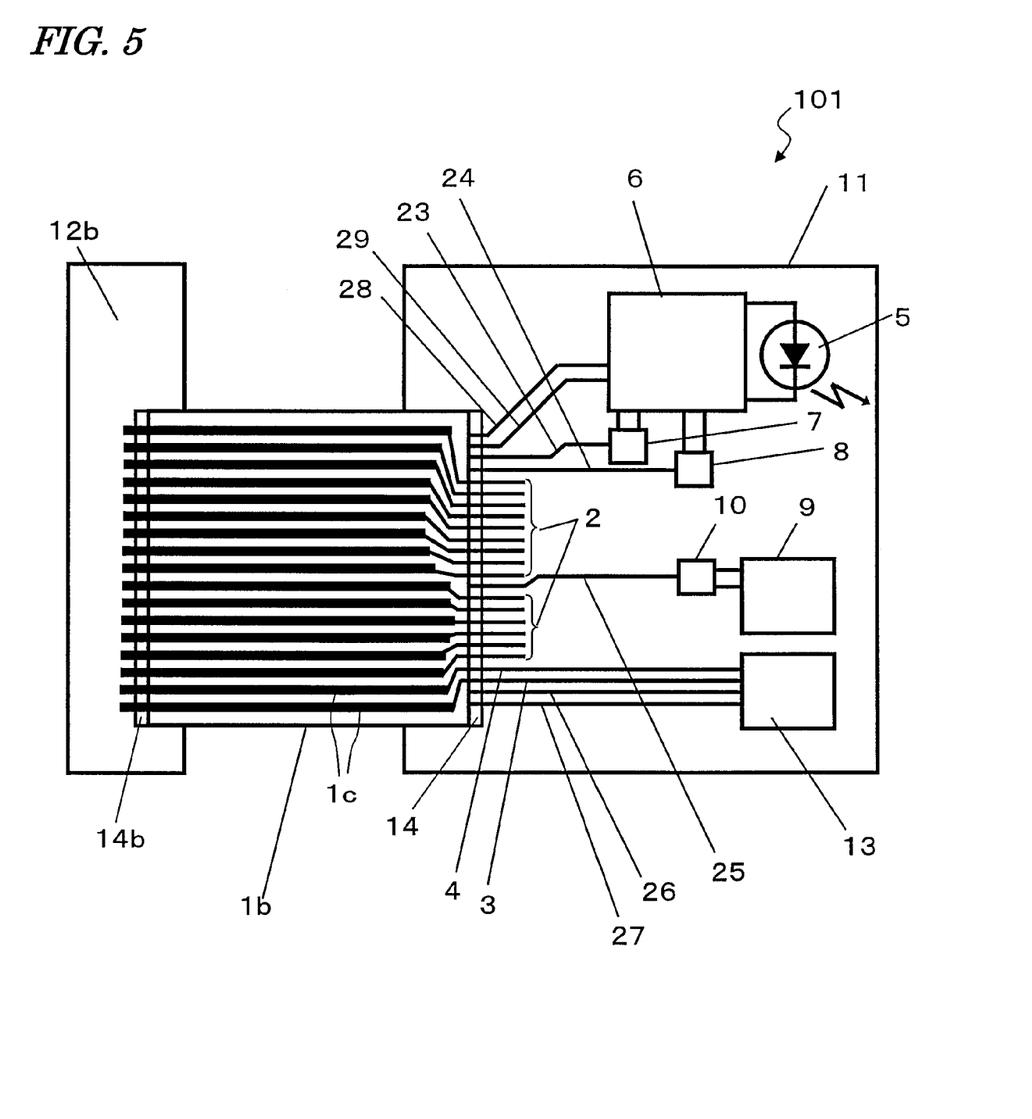
FIG. 5 A diagram showing an optical pickup device according to Embodiment 2 of the present invention.

With reference to FIG. 4 and FIG. 5, the semiconductor laser element driving IC 6, which operates with a signal from the adjustment circuit 12a or the control section 12b, operates by receiving digital serial data, this being in order to allow the semiconductor laser element 5 to emit light corresponding to a complicated strategy during a recording operation. Therefore, the adjustment circuit 12a and the control section 12b need to include complex digital circuitry which supports such data transfer.

However, among the production steps of the optical pickup device 101, there are some steps where the semiconductor laser element 5 does not need to emit light according to any complicated strategy. For example, during an emission test of the semiconductor laser element 5 or an alignment of the optical axes of some optical elements, etc., it suffices to merely effect a CW (Continuous Wave) emission with an appropriate power.

As a command to drive the semiconductor laser element 5, not only digital serial data but also an analog signal is input to the semiconductor laser element driving IC 6 of the present embodiment, which outputs a driving current that is in proportion to the analog signal.

The main FPC 11 includes a signal line 28. The signal line 28 transmits to the semiconductor laser element driving IC 6 a switching signal which is output from the adjustment circuit 12a in order to switch the semiconductor laser element driving IC 6 from an operation based on a digital signal input to an operation based on an analog signal input. The signal line 29 transmits to the semiconductor laser element driving IC 6 an analog signal which is output from the adjustment circuit 12a, and the semiconductor laser element driving IC 6 outputs a driving current which is in proportion to the input analog signal. A wiring pattern for electrically connecting the signal lines 28 and 29 to the adjustment circuit 12a is provided on the transporting FPC 1a to be used during production. The adjustment circuit 12a includes a circuit which outputs a switching signal onto the signal line 28 and a circuit which outputs an analog signal onto the signal line 29, and thus the semiconductor laser element 5 can be caused to emit light without involving transmission of any complex digital data.

Thus, during production, the transporting FPC 1a is connected to the connector section 14, and adjustments for the optical pickup device 101 are performed. After these adjustments, the transporting FPC 1a is detached from the connector section 14, and the transporting FPC 1b for use in product form is connected to the connector section 14.

When in product form, light emission is performed according to a complicated strategy and light emission is never performed with a low-speed analog input alone, and therefore it is unnecessary to use the signal lines 28 and 29 to cause the semiconductor laser element 5 to emit light. Therefore, as shown in FIG. 5, no wiring pattern for electrically connecting the signal lines 28 and 29 to the control section 12b is provided on the transporting FPC 1b for use in product form (i.e., the transporting FPC 1b does not electrically connect the signal lines 28 and 29 to the control section 12b). Since the space on the transporting FPC 1b corresponding to this omission can be allotted for other wiring lines which are needed in product form, the other wiring lines which are needed in product form can be made thick, whereby signal deterioration is prevented and the permissible current value of the wiring lines is enhanced, thus improving the stability of recording/reproduction operations. As has been described with reference to FIG. 3(b), for the aforementioned reason, the pitch 1f of the wiring lines 1c in the central portion 1d of the FPC can be made broader than the pitch 1e of the wiring lines 1c in a region of the transporting FPC 1b adjoining the connector section 14 (i.e., a connection region to the connector section 14). For example, a wiring pattern for electrically connecting the signal lines 2 to 4 for use in product form to the control section 12b is provided on the transporting FPC 1b, and these wiring lines 1c can be made thick, whereby the aforementioned effect is obtained. Moreover, the distance between adjoining wiring lines 1c can be made long, whereby crosstalk between wiring lines can be suppressed. As mentioned above, various thicknesses and inter-wire distances are required of the individual wiring lines which are included in the FPC; according to the present invention, design freedom for such individual wiring lines can be enhanced.

Moreover, since the FPC 1a or 1b is connected to the main FPC 11 via the connector section 14, it is easy to attach or detach the FPCs 1a and 1b. Therefore, there is no need to cut the wiring pattern on the transporting FPC 1a after the adjustments during production. Since reuse of the transporting FPC 1a is possible, the FPCs to be discarded can be greatly reduced, whereby a waste of resource and an increase in materials cost can be suppressed. Since it is easy to attach or detach the FPCs 1a and 1b, re-connection of the FPC 1a to the main FPC 11 is easy, and re-adjustment at the time of repairing the optical pickup device 101, defective product analysis, and the like can be easily performed. For example, even when it becomes necessary to cause the semiconductor laser element 5 to emit light by using a simplified analog circuit, this can be easily done by reconnecting the transporting FPC 1a to the main FPC 11.

Note that any wiring pattern and number of wires that has been illustrated in the descriptions of the above embodiments is exemplary, to which the present invention is not limited.

Although one semiconductor laser element, one front light monitor, and one photodetector are illustrated in the descriptions of the above embodiments, there may be two or more of each. Since the present invention creates extra margin for the space for accommodating the component elements of an optical pickup device, it is easy to mount a plurality of such component elements.

For ease of assembly of the optical pickup device and convenience regarding the materials of FPCs, the main FPC may have a construction in which a plurality of FPCs are connected.

Although an optical disk medium is exemplified as the information storage medium, it may instead be an optical card medium, a magneto-optical storage medium, or the like.

INDUSTRIAL APPLICABILITY

As has been described above, an optical pickup device and optical disk apparatus according to the present invention is particularly useful in technological fields where optical recording and/or reproduction of data for an information storage medium is performed.

The invention claimed is:

1. An optical disk apparatus comprising:
an optical pickup device; and
a control section for controlling an operation of the optical pickup device,
the optical pickup device including:
a plurality of first wiring lines for transmitting signals from the control section;
a second wiring line to be used for an adjustment of the optical pickup device; and
a connector section which is electrically connected to the first wiring lines, wherein,
the optical disk apparatus further includes
a flexible printed wiring board which is connected to the connector section for allowing the first wiring lines to be electrically connected to the control section;
the flexible printed wiring board includes a plurality of third wiring lines for electrically connecting the first wiring lines to the control section; and
a pitch of the plurality of third wiring lines in a central portion of the flexible printed wiring board is broader than a pitch of the plurality of third wiring lines in a region of the flexible printed wiring board adjoining the connector section.

2. The optical disk apparatus of claim 1, wherein,
the connector section is electrically connected to the second wiring line; and
the flexible printed wiring board being connected to the connector section electrically connects the first wiring lines to the control section, but does not electrically connect the second wiring line to the control section.

3. The optical disk apparatus of claim 1, wherein,
the optical pickup device further includes:
a semiconductor laser element for outputting laser light, and
a driving circuit for driving the semiconductor laser element;
the optical pickup device includes a plurality of said second wiring lines;
one of the second wiring lines is electrically connected to an anode of the semiconductor laser element; and
another of the second wiring lines is electrically connected to a cathode of the semiconductor laser element.

4. The optical disk apparatus of claim 1, wherein,
the optical pickup device further includes a driving circuit for driving a light source which outputs light;
when receiving a digital signal, the driving circuit drives the light source based on the digital signal, and when receiving an analog signal, the driving circuit drives the light source based on the analog signal; and
the second wiring line is a signal line for inputting the analog signal to the driving circuit.

5. The optical disk apparatus of claim 1, wherein,
the optical pickup device further includes a driving circuit for driving a light source which outputs light, and
a digital potentiometer for adjusting an amplitude of a high-frequency current which is output by the driving circuit to drive the light source; and
the second wiring line is a control line for transmitting a control signal for controlling the potentiometer.

6. The optical disk apparatus of claim 1, wherein,
the optical pickup device further includes a driving circuit for driving a light source which outputs light, and
a digital potentiometer for adjusting a frequency of a high-frequency current which is output by the driving circuit to drive the light source; and the second wiring line is a control line for transmitting a control signal for controlling the potentiometer.

7. The optical disk apparatus of claim 1, wherein,
the optical pickup device further includes
a front light monitor for receiving a portion of light which is output from a light source and outputting a photodetection signal which is in accordance with an amount of received light,
a digital potentiometer for adjusting a gain of the front light monitor; and
the second wiring line is a control line for transmitting a control signal for controlling the potentiometer.

8. The optical disk apparatus of claim 1, wherein,
the optical pickup device further includes a photodetector having a photodetecting region which is split into a plurality of regions;
the photodetector outputs a plurality of types of photodetection signals which are generated based on amounts of light respectively received by the plurality of regions;
the plurality of types of photodetection signals include a photodetection signal for position adjustment of the photodetector; and
the second wiring line is a signal line for transmitting the photodetection signal for position adjustment.

9. A flexible printed wiring board for electrically connecting an optical pickup device and a control section for controlling an operation of the optical pickup device,
the optical pickup device including:
a plurality of first wiring lines for transmitting signals from the control section;
a second wiring line to be used for an adjustment of the optical pickup device; and
a connector section which is electrically connected to the first wiring lines, wherein,
the flexible printed wiring board includes a plurality of third wiring lines for electrically connecting the first wiring lines to the control section when connected to the connector section and the control section; and
a pitch of the plurality of third wiring lines in a central portion of the flexible printed wiring board is broader than a pitch of the plurality of third wiring lines in a region of the flexible printed wiring board to be connected to the connector section.

10. An optical pickup device comprising:
a first wiring line for transmitting a signal from a control section for controlling an operation of the optical pickup device;
a second wiring line to be used for an adjustment of the optical pickup device; and
a connector section which is electrically connected to the first and second wiring lines, wherein,
during an adjustment of the optical pickup device, a first flexible printed wiring board for electrically connecting the first and second wiring lines to an adjustment circuit is connected to the connector section; and
after the adjustment, a second flexible printed wiring board which electrically connects the first wiring line to the control section but does not electrically connect the second wiring line to the control section is connected to the connector section.

11. A production method for an optical disk apparatus having
an optical pickup device, and
a control section for controlling an operation of the optical pickup device,
the optical pickup device including:
a first wiring line for transmitting a signal from the control section;
a second wiring line to be used for an adjustment of the optical pickup device; and
a connector section which is electrically connected to the first and second wiring lines,
wherein the production method comprises:
a first step of connecting to the connector section a first flexible printed wiring board for electrically connecting the first and second wiring lines to an adjustment circuit, and performing an adjustment for the optical pickup device; and
a second step of, after the first step, connecting to the connector section a second flexible printed wiring board which electrically connects the first wiring line to the control section but does not electrically connect the second wiring line to the control section.

* * * * *